United States Patent
Yagi

[19]

[11] Patent Number: 6,146,173
[45] Date of Patent: Nov. 14, 2000

[54] IC SOCKET

[75] Inventor: Masanori Yagi, Ebina, Japan

[73] Assignee: Molex Incorporated, Lisle, Ill.

[21] Appl. No.: 09/146,415

[22] Filed: Sep. 3, 1998

[30]     Foreign Application Priority Data

Sep. 5, 1997  [JP]  Japan .................................. 9-257471

[51] Int. Cl.⁷ .................................................. H01R 11/22
[52] U.S. Cl. .......................................... 439/266; 439/331
[58] Field of Search .................................. 439/266, 331,
              439/330, 72, 73, 70, 264, 265, 525, 526,
              68

[56]              References Cited

U.S. PATENT DOCUMENTS

| | | | |
|---|---|---|---|
| 4,691,975 | 9/1987 | Fukunaga et al. | 439/266 |
| 4,846,704 | 7/1989 | Ikeya | 439/72 |
| 4,886,470 | 12/1989 | Billman et al. | 439/266 |
| 4,919,623 | 4/1990 | Billman et al. | 439/70 |
| 5,009,609 | 4/1991 | Matsuoka et al. | 439/73 |
| 5,045,923 | 9/1991 | Matsuoka | 357/79 |
| 5,076,798 | 12/1991 | Uratsuji | 439/269 |
| 5,114,358 | 5/1992 | Myers | 439/266 |
| 5,261,832 | 11/1993 | Uratsuji et al. | 439/266 |
| 5,308,256 | 5/1994 | Tonooka et al. | 439/266 |
| 5,328,383 | 7/1994 | Savant | 439/266 |
| 5,352,130 | 10/1994 | Nagumo | 439/266 |
| 5,364,284 | 11/1994 | Tohyama et al. | 439/266 |
| 5,368,497 | 11/1994 | Nagumo | 439/266 |
| 5,370,559 | 12/1994 | Matsuoka | 439/733 |
| 5,387,118 | 2/1995 | Kishi et al. | 439/266 |
| 5,443,396 | 8/1995 | Tokushige | 439/266 |
| 5,562,470 | 10/1996 | Petersen | 439/259 |
| 5,658,153 | 8/1997 | Ikeya et al. | 439/72 |

*Primary Examiner*—Gary F. Paumen
*Assistant Examiner*—Ross Gushi
*Attorney, Agent, or Firm*—Charles S. Cohen

[57]              ABSTRACT

Disclosed is an improved IC socket comprising a housing having terminals and an opening-and-closing mechanism to change the terminals from a contact-making position to a contact-releasing position. The housing has a platform to receive the lead wires of the IC, and a movable cover activates a swingable member which rotates. The opening-and-closing mechanism is positioned so that the swingable member tilts the opening-and-closing mechanism toward the contact-releasing position when the movable cover is depressed. The device is designed as to leave between the lead platform and a contact end a clearance C, which is smaller than the thickness T of the lead wire. Clearance C prevents any debris from sticking on the contact end, assuring the reliability of electric contacts with the lead wires of the IC. A flat cam surface on the swingable member has a variable operative slope which varies as the swingable member tilts clockwise and then counterclockwise, so that gradual and steep slopes are provided continuously as the swingable member swings about a pivot. This continuous slope variation avoids any odd feeling when the operator pushes the movable cover down.

23 Claims, 5 Drawing Sheets

IC SOCKET

BACKGROUND OF THE INVENTION

The present invention relates to a socket for an integrated circuit ("IC") in order to test components of the IC by a procedure which includes receiving and holding the lead wires of the IC. As is well known in the art, sockets are used in the making of required electrical connections between ICs and printed circuit boards, or in the testing of ICs.

Such a known IC socket has a lead set to bear the lead wires of an IC thereon and a plurality of terminals to make required electric connections to the lead wires of the IC, which lead wires stay on the lead seat of the IC socket. In order to be sure that the individual terminals of the IC socket are put in contact with counter lead wires of the IC, the terminals are so designed that their contacts are resiliently urged and pushed against the upper surfaces of the lead wires of the IC, as it is seen from Japanese Patent No. 2527673.

Also, such an IC socket has an opening-and-closing mechanism to facilitate attachment and removal of the IC therefrom, which opening-and-closing mechanism has an abutment means to abut the cantilever limb of each terminal. Descending action of the abutment means will cause the terminal to release the associated lead wire therefrom, as seen from Japanese Patent Application Laid-Open Nos. 7-201430 and 7-54835. The abutment means has a cam surface which has the effect of reducing an actuating force and assuring the opening and closing operation.

A conventional IC socket as shown in Japanese Patent No. 2527673 has terminals to permit its contacts to be pushed against the upper surfaces of the lead wires of an IC in order to make sure that reliable electric connections be made between the terminals and the lead wires of the IC. When no lead wires are inserted in the IC socket, the contacts of the terminals stay or hang up on the lead seat of the socket housing. Disadvantageously, this is liable to cause some terminals to have debris stick on or to their contacts, causing incomplete electric connections. Such debris can result from the molding of IC sockets.

Another conventional IC socket is shown in Japanese Patent Application Laid-Open Nos. 7-201430 and 7-54832, which incorporate a dual-sloped member. Such dual-sloped member structure does not provide smooth movement between its differently sloped surfaces, one being shallower and easier to depress, the other being steeper and requiring more effort to depress. These differences cause users to feel an abrupt movement at the transition between the differing slopes during the opening-and-closing operation. The resistance encountered during the depressing action changes, causing concern that a proper connection might not have been effected.

The present invention is directed to a socket for receiving and holding an integrated circuit which overcomes the aforementioned disadvantages.

SUMMARY OF THE INVENTION

Accordingly, it is a general object of the present invention is to provide an IC socket that permits smooth insertion and withdrawal of an IC from the socket, while assuring reliable electrical connections to the lead wires of the IC.

To attain this object, an IC socket is provided having a housing with a plurality of terminals mounted therein for contacting the lead wires of an IC. Also included is an opening-and-closing mechanism that changes the socket terminals from their closing position where they contact the IC lead wires to their opening position where they release contact with the IC lead wires. The housing has a lead set to permit the lower surfaces of the lead wires of the IC to stay thereon, and said opening-and-closing mechanism comprises an upper movable cover positioned above the terminals to cover them and an abutment means fixed to said upper movable cover. Each of the terminals includes a contact arm and a cantilever arm, said opening-and-closing mechanism being so positioned that said abutment means may abut the free end of said cantilever arm, thereby permitting the contact arms of said terminals to be put in their contact-releasing position by lowering said upper movable cover.

In an illustrated embodiment of the present invention, the contact arm has a contact end to make contact with a selected lead wire of the IC, a first support projection is formed just below the contact end and a second support projection formed on the lower corner of the contact arm. Each of the illustrated terminals has a resilient curved joint and a tail section, said curved joint providing biasing action and being connected at one end both to said cantilever arm and to said contact arm, and at the other end to said tail section. The tail section is fixed to the bottom of said housing to be connected to selected conductors in a printed circuit board. With further reference to the illustrated housing, it has a notched recess to support the contact arm of each terminal with its first support projection abutting the vertical wall of said notched recess and with its second support projection staying on the shelf of said notched recess, thereby leaving between the lead set and the contact end a clearance which is smaller than the thickness of the lead wire of the IC to be received. The existence of such a clearance has the effect of preventing debris from sticking to the contact of terminals, thus assuring reliable electric connections to the lead wires of the IC.

The abutment assembly may include a cam surface in the form of the flat surface formed on a rotatable member, which is rotatably fixed to an associated support projection or pivot in said upper movable cover, said cam surface being adapted to incline first clockwise and then counterclockwise in its descendent travel, thereby providing relatively shallow and steep slopes continuously as said rotatable member swings about the pivot. This arrangement permits the smooth transition between the slopes.

This invention includes a cam surface having a single profile which works with two different operational slopes that are made functional depending upon movement of the member bearing the cam surface and preferably also movement of the opening-and-closing mechanism.

Other objects and advantages of the present invention will be clearly understood from the following description of an IC socket according to one preferred embodiment of the present invention, explained in the following detailed description.

BRIEF DESCRIPTION OF THE DRAWINGS

In the course of the following detailed description reference will be frequently made to the accompanying drawings in which.

DESCRIPTION OF THE PREFERRED EMBODIMENTS

Figure 1:
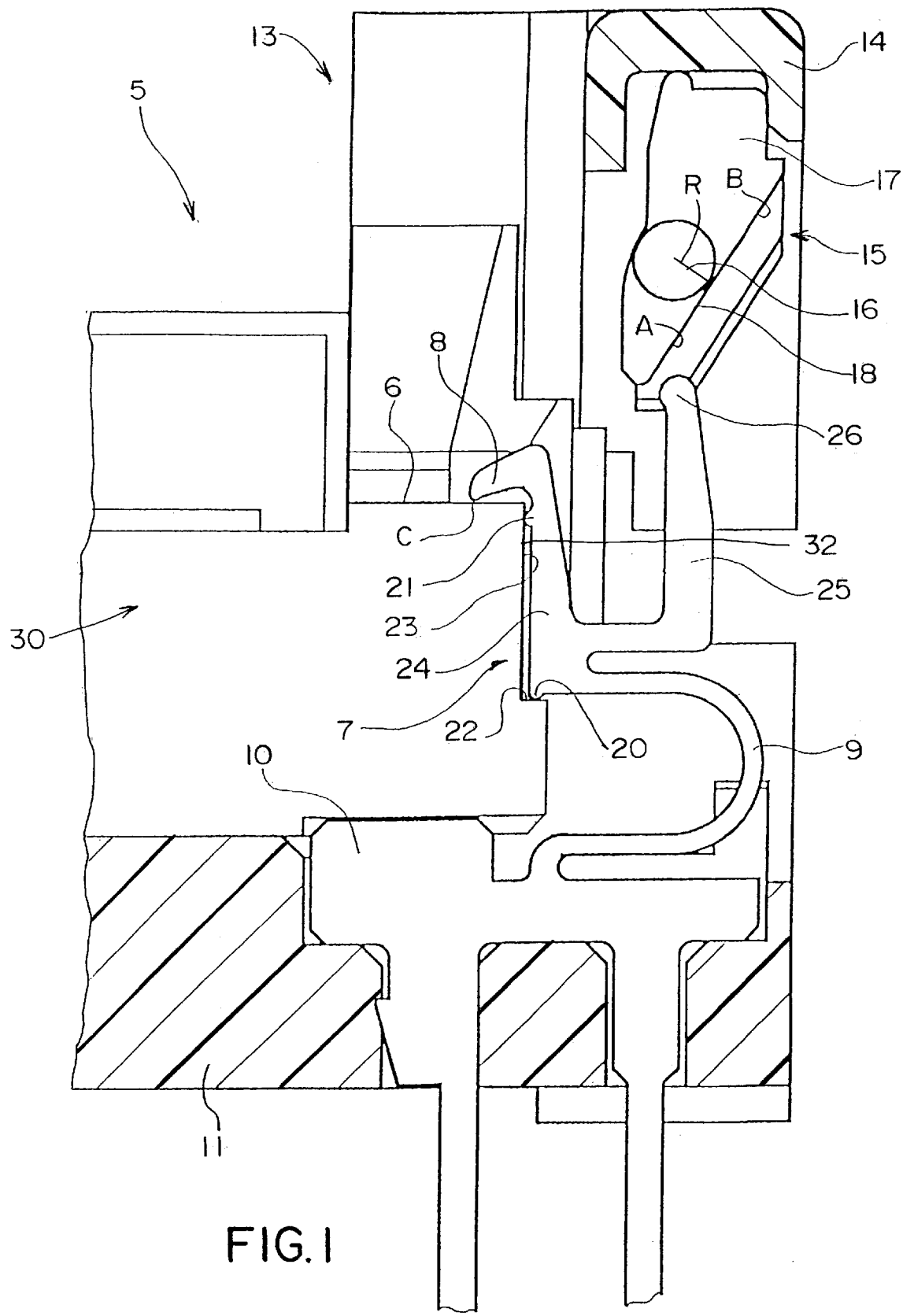
FIG. 1 is an elevational sectional view of an IC socket constructed in accordance with the principles of the present invention.

Referring first to FIG. 1, an IC test socket constructed in accordance with the principles of the present invention is designated generally at 5. The test socket 5 includes an insulative housing 30 having a plurality of conductive terminals 7 arranged therein at predetermined intervals and mounted within the housing in position to contact the lead wires 2 of an IC 1 (FIG. 4), the IC lead wires 2 being illustrated as extending laterally therefrom.

Figure 3:
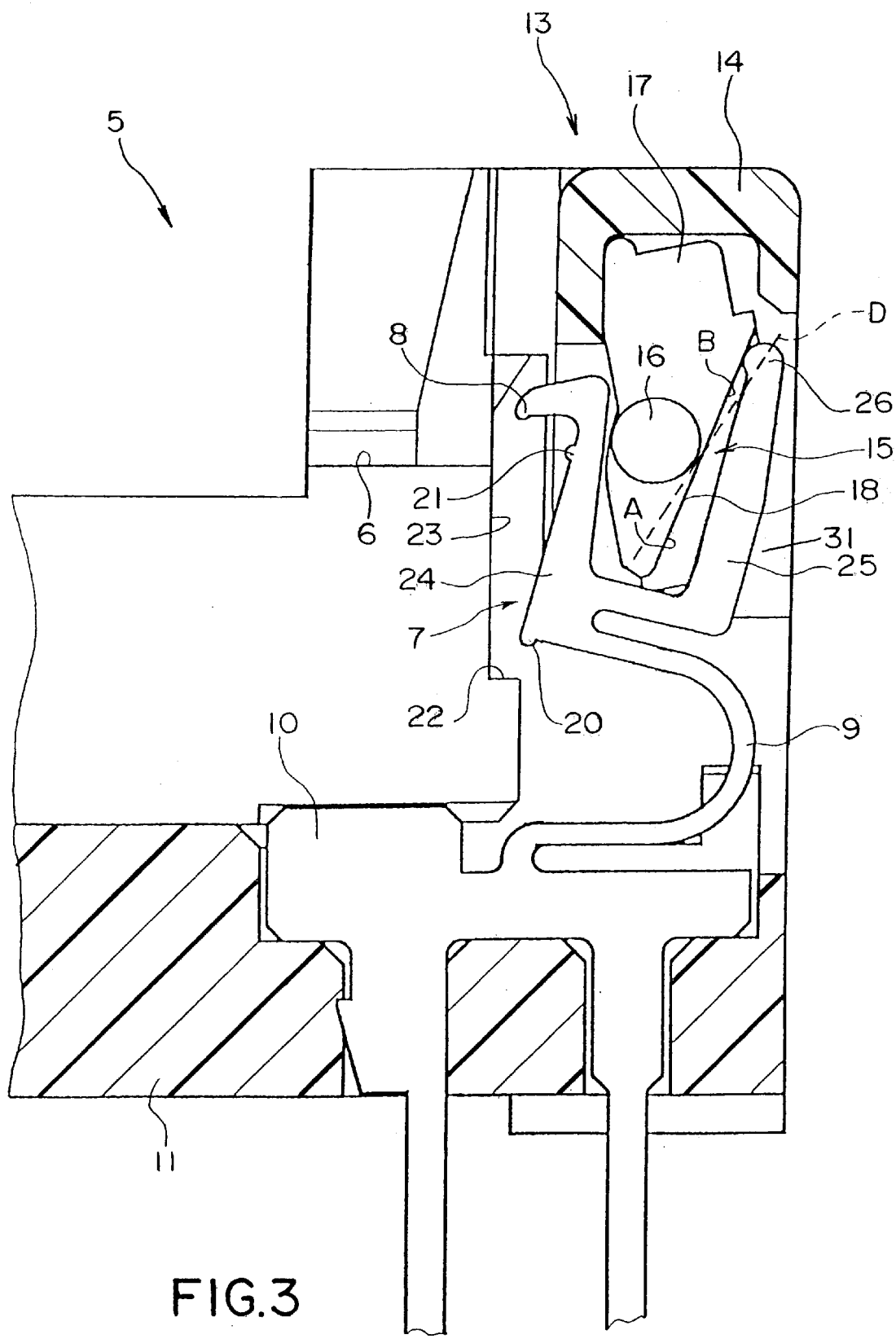
FIG. 3 is a view similar to that of FIG. 1, but illustrating the test socket mechanism in an open position where the terminal contact arm is moved to an open position to release the lead wires of the IC.
Figure 4:
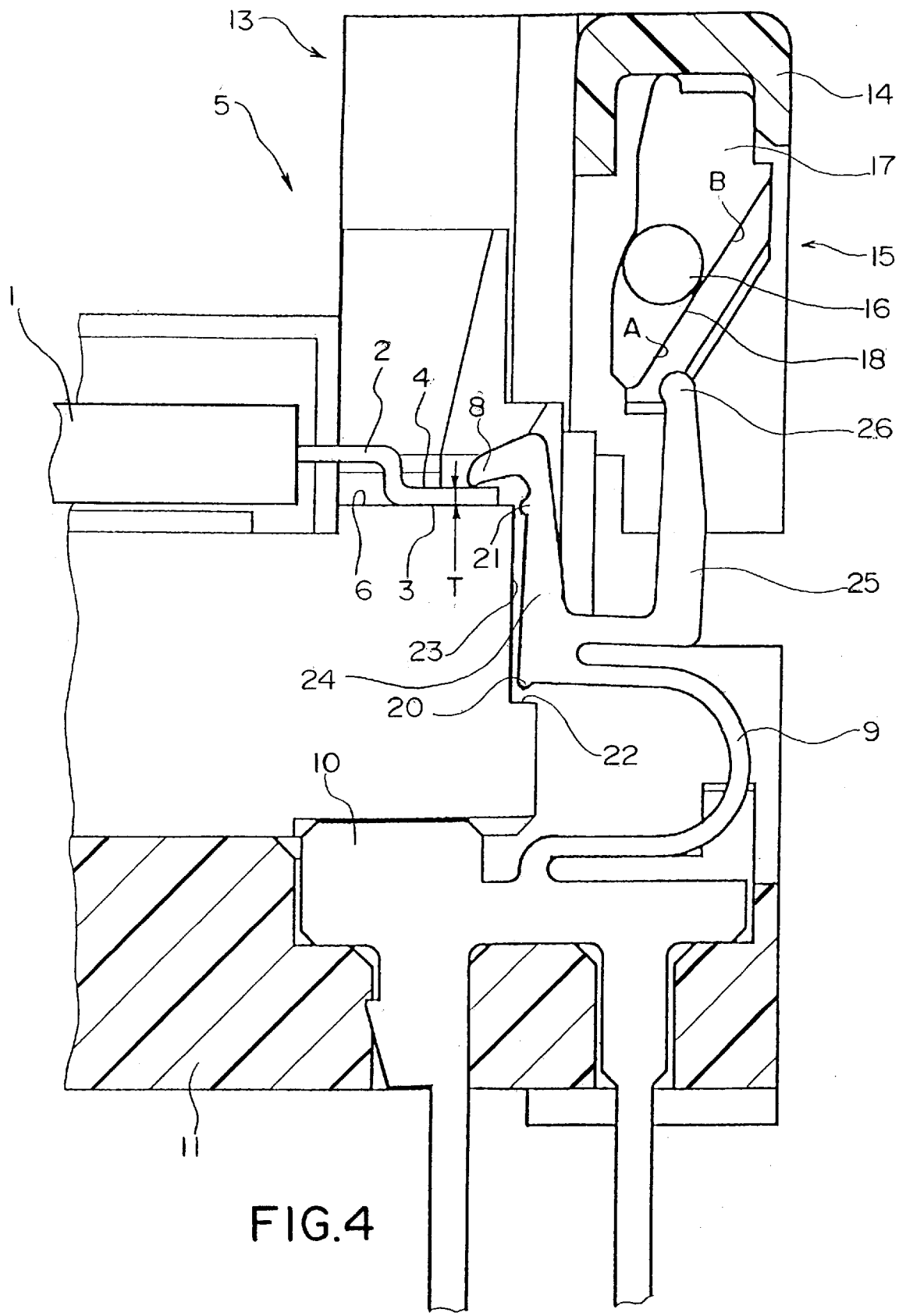
FIG. 4 is a view similar to that of FIG. 3, but illustrating the test socket mechanism in a closed position where the terminal contact arm is moved to a closed position to hold the lead wires of the IC in place within the test socket; and, FIG. 5 shows an alternate embodiment of a test socket terminal constructed in accordance with the principles of the present invention.

The test socket housing also includes a mechanism 13 that opens and closes the test socket 5 so that the IC may be inserted into the socket 5 for testing and then subsequently removed from the socket 5. Actuation of this mechanism moves the test socket terminals 7 between two operative positions, from a closed position in which the terminals 7 make electrical contact with the IC leads, as illustrated in FIG. 4, and an open position in which they are released from contact with the IC leads 2, as illustrated in FIG. 3, and vice-versa.

The test socket housing has an IC seat, or platform 6, that supports the IC 1 in place within the test socket 5, primarily by supporting the lower surfaces 3 of the IC lead wires 2. The socket opening-and-closing mechanism 13 includes an upper, movable cover 14 that is positioned above the terminals 7 and their respective mounting cavities 31 in order to cover them, and an actuating assemble 15 which is movably mounted to the test socket movable cover 14 in alignment with and above the test socket terminals 7.

It can be seen from the drawings that each conductive terminal 7 includes a contact limb or arm 24, a cantilevered trigger limb or arm 25 spaced therefrom, a mounting tail section 10, and a biasing or spring member such as resilient generally C-shaped curved joint 9 that joins the mounting tail section 10 and the two arms 24 and 25 together. The curved joint 9 is connected at one end to the arms 24 and 25 and at the other end to the mounting tail section 10, which may be fixed to the bottom 11 of the test socket housing as illustrated for connecting the test socket 5 to an associated printed circuit board (not shown). The curved joint 9 is capable of both compression in which it is bent toward the test socket terminal contact position (FIG. 4), and expansion in which it expands to a stress-free, test socket terminal release position. (FIG. 3.)

Figure 2:
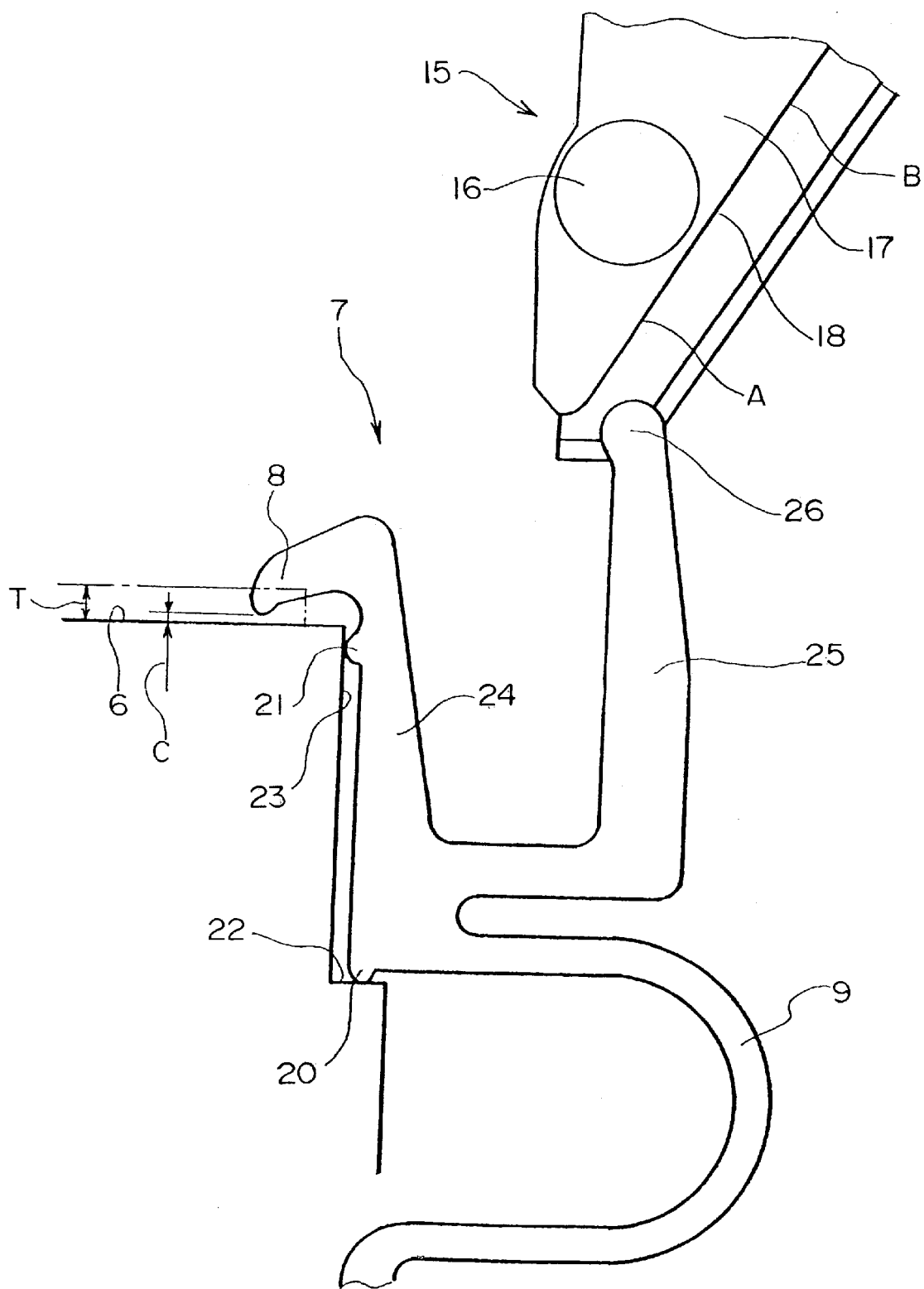
FIG. 2 is an enlarged detailed view of a portion of the test socket of FIG. 1, illustrating the test socket terminal contact arm and its position with respect to the recessed notch of the test socket housing.

In this regard, the terminal contact arm 24 has a free end 8 that makes contact with a corresponding, opposing lead wire 2 of the IC. This contact arm 24 also includes a first standoff illustrated as a horizontal projection 21 formed therewith just below the free end 8, and a second standoff in the form of a vertical projection 20 formed on the base of the contact arm 24. As mentioned above, the first standoff 21 is oriented generally horizontally, while the second standoff is oriented generally vertically. The test socket housing 30 includes a recess, illustrated as a notch 23, that is disposed along its terminal-confronting vertical wall and positioned such that each terminal contact arm 24 is supported by its associated first standoff 21 abutting the vertical wall 32 of the recessed notch 23, while the second standoff 20 abuts the horizontal portion 22 of the recessed notch 23, thereby leaving a clearance C between the IC seat or platform 6 and the terminal contact end 8 that is less than the thickness T of the IC lead wire 2. (FIG. 2.) As seen best in FIG. 4, the IC lead wires 2 are forced against the IC seat 6 by the terminal contact ends 8 when in an IC-contacting position, and they apply a downward resilient force which is a function of the difference of the thickness T of the IC lead wires 2 and the clearance C, i.e. (T–C).

The opening-and-closing mechanism 13 is used for opening and closing the test socket 5 to facilitate inserting and removing the IC 1 from the socket 5. As described earlier, it includes the upper movable cover 14 and the actuating assembly 15. The opening-and-closing mechanism 13 is positioned so that the actuating assembly 15 will abuttingly engage the free ends of the cantilevered trigger arms 25 of the socket terminals 7 when the movable cover 14 is fully depressed, thereby forcing the terminal contact arms 24 to move back to their contact-releasing position as the cantilevered trigger arms 25 are forced backward at an angle. (FIG. 3).

The actuating assembly 15 includes a cam member 17 having a flat cam surface 18 that is formed at an acute angle to provide a sloped surface. The cam member 17 is movably mounted to the movable cover 14 by way of a projection or support pin 16 formed thereon, and the cam member 17 moves around the support pin 16 when it contacts the cantilevered triggering arm 25 of the test socket terminal as explained in greater detail below.

As the cam member 17 moves around the support pin 16, the operative slope of the cam surface 18 changes from a gradual slope to a steeper slope. In this regard, the flat cam surface 18 may be considered as having two distinct sections, A and B (FIG. 4), that lie on opposite sides of the support pin 16 and are separated at a line R perpendicular to the cam surface 18. These two sections include a head section A and a tail section B. When the head section A of cam surface 18 is put in contact with the free ends 26 of the cantilevered trigger arms 25, the cam surface 18 adopts and provides a gradual operative slope, illustrated in phantom at D in FIG. 3. Subsequently, upon further downward movement of the actuating means 15, the cam surface tail section B is then put in contact with the free ends 26 of the cantilevered trigger arms 25 and the cam surface 18 adopts and provides the steep operative slope illustrated in solid in FIG. 3. This gradual-to-steep operative slope transition occurs in a continuous fashion concurrent with movement of the cam member 17 about its support pin 16. Such a continuous transition presents a smooth operative "feel" to the operation of the test socket 5 and prevents the user from feeling a hard and sharp interrupted movement as would be the case with an abrupt stepped gradual-to-steep structural slope transition.

Now, the manner in which the IC socket 5 is used will be described. Referring now to FIG. 1, the IC socket 5 is shown in a pre-insertion state, where the contact arm 24 of each test socket terminal 7 is supported in a rest condition where its first standoff 21 abuts the vertical wall of the recessed notch 23 and where its second standoff 20 abuts the horizontal portion 22 of the recessed notch 23, thereby leaving the clearance C between the IC seat or platform 6 and the test socket terminal contact end 8, which is less than the thickness T of the IC lead wires 2 of the IC 1. (FIG. 2.) In this pre-insertion state, the upper movable cover 14 is raised to its highest level, and the engagement surface of actuating assembly 15 is spaced apart above the cantilevered trigger arm free ends 26 of the test socket terminals 7.

Referring now to FIG. 3, the socket opening-and-closing mechanism 13 is actuated by depressing the upper cover 14, typically by pressing down thereupon until a surface of the actuating assembly 15 engages the cantilevered trigger arm free ends 26 of the terminals 7 until they are moved backward toward the contact-releasing position illustrated.

At first, the cam surface 18 provides an operative gradual slope (D in FIG. 3), and then the operative slope increases to a steep slope as the point at which the cantilevered trigger arms 25 ride on the cam surface 18 moves past the support pin 16, thus allowing the cam member 17 to move on its support pin 16 counterclockwise to thereby provide the steep slope shown in FIG. 3.

When the cam surface head section A contacts the free ends 26 of the cantilevered trigger arms 25, the cam member 17 is positioned about the support pin 16 in order to exhibit the gradual slope position, and when the cam surface tail section B contacts the cantilevered trigger arm free ends 26, the cam member 17 is inclined about the support pin 16 to provide the steep slope position. The movement of the two cam surface sections A and B may be characterized as having opposite movements. That is, when the terminal trigger arm free ends initially contact the cam member 17 at the cam surface head section A, the cam surface head section A will move (typically rotate) clockwise around the support pin 16. However, when the trigger arm free ends 26 ride upon the cam surface 18 and make the transition to the tail section B, the cam surface tail section B will move counterclockwise around the support pin 16.

As mentioned above, the gradual-to-steep operative slope transition is caused by the cam member 17 moving to displace the positions of the cantilevered trigger arm free ends 26 from the cam surface head section to tail section, thus causing such a smooth transition that the user does not detect the slope change and may have no odd feeling at the point of transition.

Referring now to FIG. 4, the lead wires 2 of the IC 1 are laid on the IC seat or platform 6 and the downward pressure on the cover 14 is released, thereby permitting the socket terminal contact ends 8 to push the lead wires 2 against the IC seat 6 when the opening-and-closing mechanism 13 returns to its original position of FIG. 1. Each socket terminal 7 thereby applies a reliable mating force against the IC lead wires 2, which is a function of the difference between the thickness T of the lead wire 2 and the clearance C. This force is strong enough to assure that a reliable electric connection is made between the IC lead wire 2 and the terminal 7.

When the IC socket 5 is empty, the terminal contact end 8 is kept a small distance C apart from the IC seat 6, and therefore, no debris such as might be left after the IC socket 5 is molded will stick to the contact end 8 of any test socket terminal 7, thereby eliminating the possibility of making a poor electric connection between the lead wire 2 and the counter contact end 8 as would be caused by intervening debris.

Figure 5:
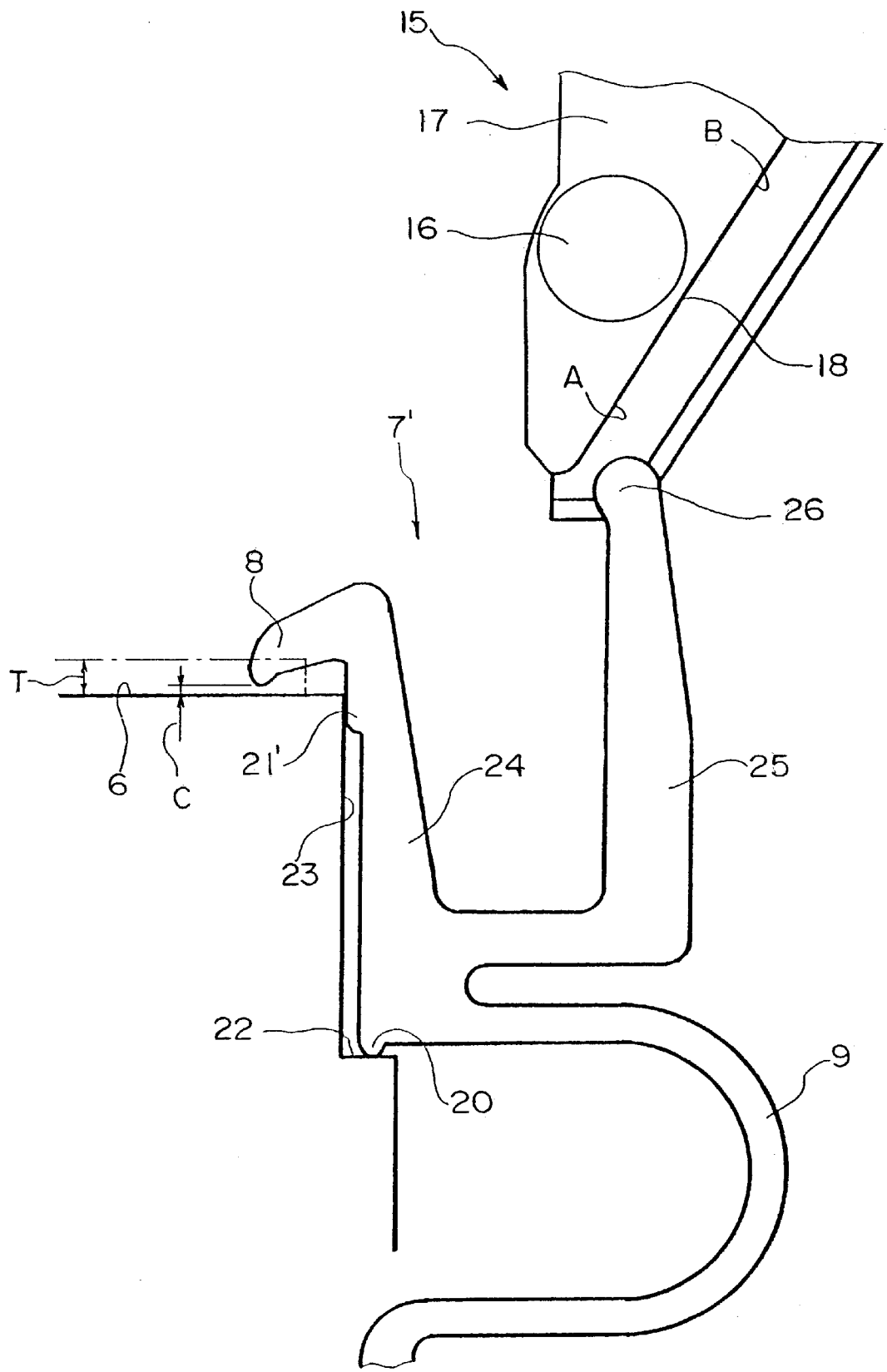

Referring now to FIG. 5, an alternate embodiment of terminal 7' is illustrated wherein the first standoff 21' has a step-like form, which simplifies the terminal shape for stamping from sheet metal.

While the preferred embodiments of the invention have been shown and described, it will be apparent to those skilled in the art that changes and modifications may be made therein without departing from the spirit of the invention, the scope of which is defined by the appended claims.

What is claimed is:

1. An integrated circuit (IC) socket which receives and holds lead wires of an IC, the IC socket comprising:
    an insulative housing having an IC platform of said housing to permit IC lead wires to be positioned thereon;
    a plurality of terminals mounted on said housing to make contact with the IC lead wires, each said terminal having a contact-making position and a contact-releasing position; and
    an opening-and-closing mechanism having a swingably mounted cam member which has a cam surface, said cam surface swings through an operative slope continuous range which varies between a first slope orientation and a second slope orientation when said terminal slides along said cam surface in response to movement of said opening and closing mechanism in order to move the terminal between its contact-making position and its contact-releasing position.

2. The IC socket according to claim 1, further including a support projection which swingably mounts said cam member.

3. The IC socket according to claim 1, wherein when the terminal is at the contact-making position, said terminal engages an IC lead wire, when present, having a thickness T, and when an IC lead wire is not present the terminal engages the platform or is spaced from the platform by a clearance C, the clearance C being less than the thickness T of the IC lead wire.

4. The IC socket according to claim 1, wherein said opening-and-closing mechanism has a movable cover which moves said cam surface into engagement with the terminal in order to move the terminal to its contact-releasing position.

5. The IC socket according to claim 1, wherein said terminal has a contact limb, said contact limb assumes said contact-making position at an undepressed position of the opening-and-closing mechanism, and said contact limb assumes said contact-releasing position at a depressed position of the opening-and-closing mechanism.

6. The IC socket according to claim 5, further including a trigger limb of the terminal, said trigger limb being in operative engagement with the cam surface such that movement of the opening-and-closing mechanism moves said cam member into engagement with trigger limb, resulting in swinging of said cam member and movement of said contact limb.

7. The IC socket according to claim 6, further including a spring portion of the terminal, which spring portion biases the contact limb to its said contact-making position.

8. The IC socket according to claim 7, wherein said contact limb has a contact end and a first standoff spaced therefrom, and said first standoff engages a surface of the housing in order to define a spacing between the platform and said contact end.

9. The IC socket according to claim 8, further including a second standoff of the contact limb which cooperates with said first standoff by engaging a second surface of the housing.

10. The IC socket according to claim 1, wherein said cam surface is a continuous flat surface which displays said operative slope which changes upon swinging movement of said cam surface upon urging of said opening-and-closing mechanism.

11. The IC socket according to claim 10, wherein said cam surface includes a head section A and a tail section B, and the actuation assembly moves to have the cam surface provide a gradual slope when said terminal contacts said head section, and the actuation assembly moves to have said cam surface provide a steep slope when said terminal engages said tail section.

12. An integrated circuit (IC) socket which receives and holds lead wires of an IC, the IC socket comprising:

an insulative housing having an IC platform to permit IC lead wires to be positioned thereon;

a plurality of terminals mounted thereon to make contact with IC lead wires, each said terminal having a contact-making position and a contact-releasing position, said terminal having a contact limb which contacts the IC lead wire when said terminal is in its contact-making position;

an actuation assembly which is accessible by an operator of the IC socket, said actuation assembly having a cam member which is swingably mounted by a support projection of said actuation assembly, and said swingably mounted cam member has a uniplanar flat cam surface which has an operative slope that varies over a continuous range when said cam member swings between a first slope orientation when said actuation assembly is undepressed and a second slope orientation when said actuation assembly is depressed; and said terminal has a trigger limb which rides upon said flat cam surface of the actuation assembly in response to depression of the actuation assembly in order to move the contact limb so as to move between the contact-making position and the contact-releasing position.

13. The IC socket according to claim 12, wherein said contact limb assumes said contact-making position at the undepressed position of the actuation assembly, and said contact limb assumes said contact-releasing position at the depressed position of the actuation assembly.

14. The IC socket according to claim 12, wherein when the terminal is at the contact-making position, the contact limb engages an IC lead wire, when present, having a thickness T, and, when an IC lead wire is not present, the contact limb engages the platform or is spaced from the platform by a clearance C, the clearance C being smaller than the thickness T of the IC lead wire.

15. The IC socket according to claim 12, further including a spring portion of the terminal, which spring portion biases the contact arm to its said contact-making position.

16. The IC socket according to claim 15, wherein said contact limb has a contact end, a first standoff spaced therefrom, and a second standoff spaced from the first standoff, and said first and second standoffs engage respective surfaces, of the housing in order to define the spacing between the platform and said contact end.

17. The IC socket according to claim 12, wherein said cam surface includes a head section A and a tail section B, and the actuation assembly moves to have the cam surface provide a gradual slope when said trigger limb contacts said head section, and the actuation assembly moves to have said cam surface provide a steep slope when said trigger limb engages said tail section.

18. An integrated circuit (IC) socket which receives and holds lead wires of an IC, the IC socket comprising:

an insulative housing having a plurality of socket terminals mounted thereon to make contact with the lead wires of an IC, each said socket terminal having a contact-making position and a contact-releasing position;

a platform of said housing to permit an IC lead wire to be positioned thereon;

said socket terminal having a cantilevered contact arm mounted to the housing by a curved joint, said socket terminal further including a cantilevered trigger arm, and said contact arm contacts the IC lead wire when said socket terminal is in its contact-making position; and an actuation assembly having a movable cover which is accessible by an operator of the IC socket, said actuation assembly having a cam member swingably mounted on said actuation assembly so as to move with said cover, said cam member having a cam surface which rides upon said trigger arm when said actuation assembly is depressed, the cam surface having a continuous profile which has an operative slope that changes when said cam member swings between a first slope orientation and a second slope orientation in response to movement of said cam surface along said trigger arm.

19. The IC socket according to claim 18, wherein said trigger arm is responsive to depression of the actuation assembly in order to move the contact arms so as to move between the contact-making position and the contact-releasing position in opposition to biasing forces provided by said curved joint.

20. The IC socket according to claim 18, wherein a support projection swingably mounts said cam member.

21. The IC socket according to claim 18, wherein, at said contact-making position of the socket terminal, the contact arm engages an IC lead wire, when present, having a thickness T, and, when an IC lead wire is not present, engages the platform or is spaced from the platform by a clearance C, the clearance C being smaller than the thickness T of the IC lead wire.

22. The IC socket according to claim 18, wherein said cam surface is a uniplanar flat surface which displays said operative slope, said operative slope has a continuous range which varies between said first slope orientation and said second slope orientation, said cam surface includes a head section A and a tail section B, and the actuation assembly moves to have the cam surface provide a gradual slope when said trigger arm contacts said head section, and the actuation assembly moves to have said cam surface provide a steep slope when said trigger arm engages said tail section.

23. The IC socket according to claim 22, wherein said trigger arm moves in a direction away from the platform when a free end thereof first engages said head section A and continues in this direction until the free end moves generally toward the platform.

* * * * *